(12) United States Patent
Kitamura et al.

(10) Patent No.: US 8,055,392 B2
(45) Date of Patent: Nov. 8, 2011

(54) ELECTRONIC DEVICE

(75) Inventors: Hideo Kitamura, Tokyo (JP); Kenji Hirohata, Tokyo (JP); Katsumi Hisano, Matsudo (JP); Tomonao Takamatsu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 356 days.

(21) Appl. No.: 12/472,625

(22) Filed: May 27, 2009

(65) Prior Publication Data
US 2009/0299531 A1 Dec. 3, 2009

(30) Foreign Application Priority Data
May 30, 2008 (JP) .................. 2008-143237

(51) Int. Cl.
*G05D 23/00* (2006.01)
*F28F 27/00* (2006.01)
*F01P 7/14* (2006.01)
(52) U.S. Cl. .. 700/300; 700/299; 123/41.1; 123/339.18; 236/36; 236/37
(58) Field of Classification Search .......... 700/299–300; 123/41.1, 339.18; 236/36–37; 73/45.8, 114.68
See application file for complete search history.

(56) References Cited

U.S. PATENT DOCUMENTS

| | | | | |
|---|---|---|---|---|
| 6,496,369 B2* | 12/2002 | Nakamura | | 361/697 |
| 7,121,103 B2* | 10/2006 | Itoh et al. | | 62/173 |
| 7,345,874 B2* | 3/2008 | Cheng et al. | | 361/695 |
| 7,643,295 B2* | 1/2010 | Chao et al. | | 361/700 |
| 7,682,720 B2* | 3/2010 | Tighe et al. | | 429/413 |
| 7,852,628 B2* | 12/2010 | Hirohata et al. | | 361/695 |
| 2003/0066638 A1* | 4/2003 | Qu et al. | | 165/186 |
| 2004/0069546 A1* | 4/2004 | Lou et al. | | 180/65.2 |
| 2007/0058346 A1* | 3/2007 | Yeh | | 361/697 |
| 2007/0131383 A1* | 6/2007 | Hattori et al. | | 165/11.2 |
| 2009/0199997 A1* | 8/2009 | Koplow | | 165/80.3 |
| 2010/0177480 A1* | 7/2010 | Koplow | | 361/697 |
| 2010/0182809 A1* | 7/2010 | Cullinane et al. | | 363/34 |

FOREIGN PATENT DOCUMENTS

JP 2004-4063993 A 2/2004
JP 2007-189183 A 7/2007

OTHER PUBLICATIONS

U.S. Appl. No. 12/402,702, filed Mar. 12, 2009, Sakaguchi, et al.

* cited by examiner

*Primary Examiner* — Ramesh Patel
(74) *Attorney, Agent, or Firm* — Ohlandt, Greeley, Ruggiero & Perle, L.L.P.

(57) ABSTRACT

An electronic device includes a deviation value calculation unit which calculates a deviation value from the normal boundary of the relationship between a power index associated with the driving power and the measured rotational speed of the fan, a clogging detection unit which detects, based on the deviation value, clogging in an air duct through which the fan takes in air outside the case and sends it to the radiator, and a deviation value correction unit which corrects the deviation value in accordance with aging of performance of the fan to compensate for deterioration of the clogging detection capability of the clogging detection unit caused by the aging.

8 Claims, 12 Drawing Sheets

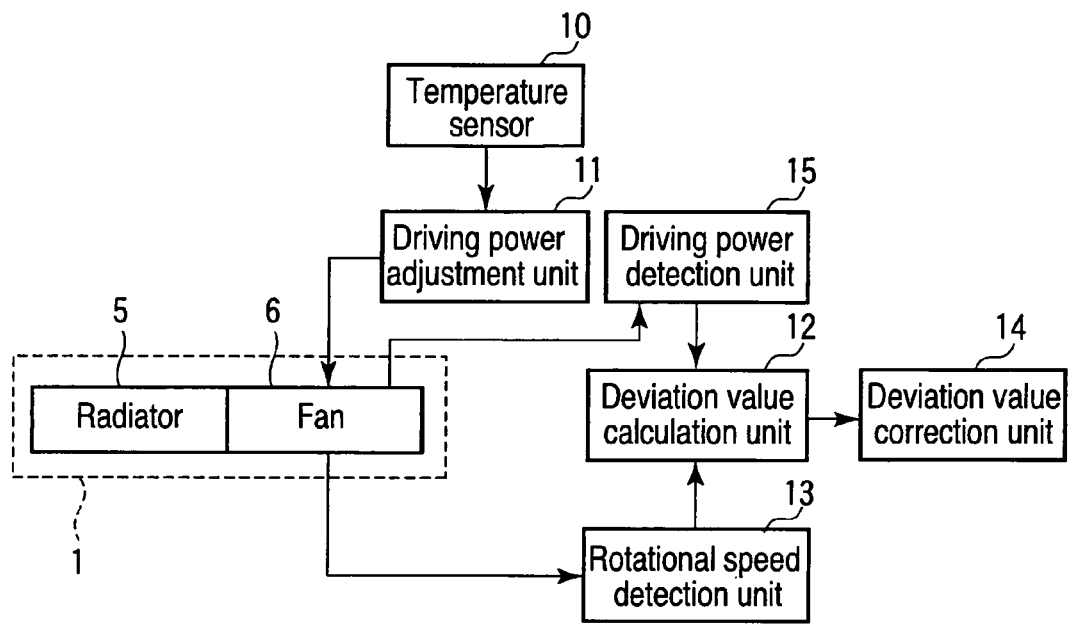
F I G. 3
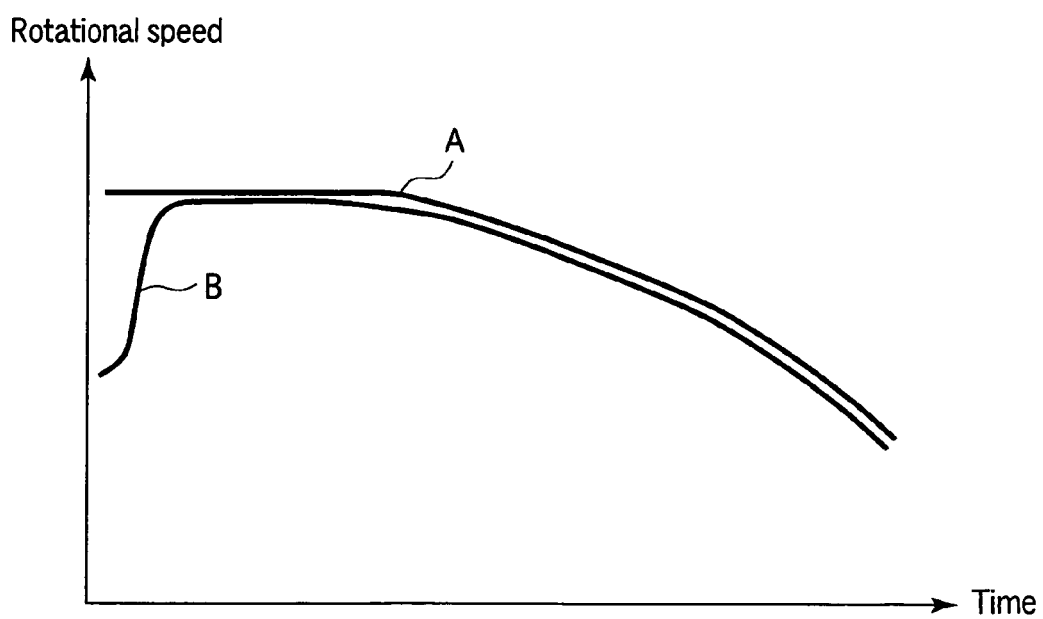
F I G. 4

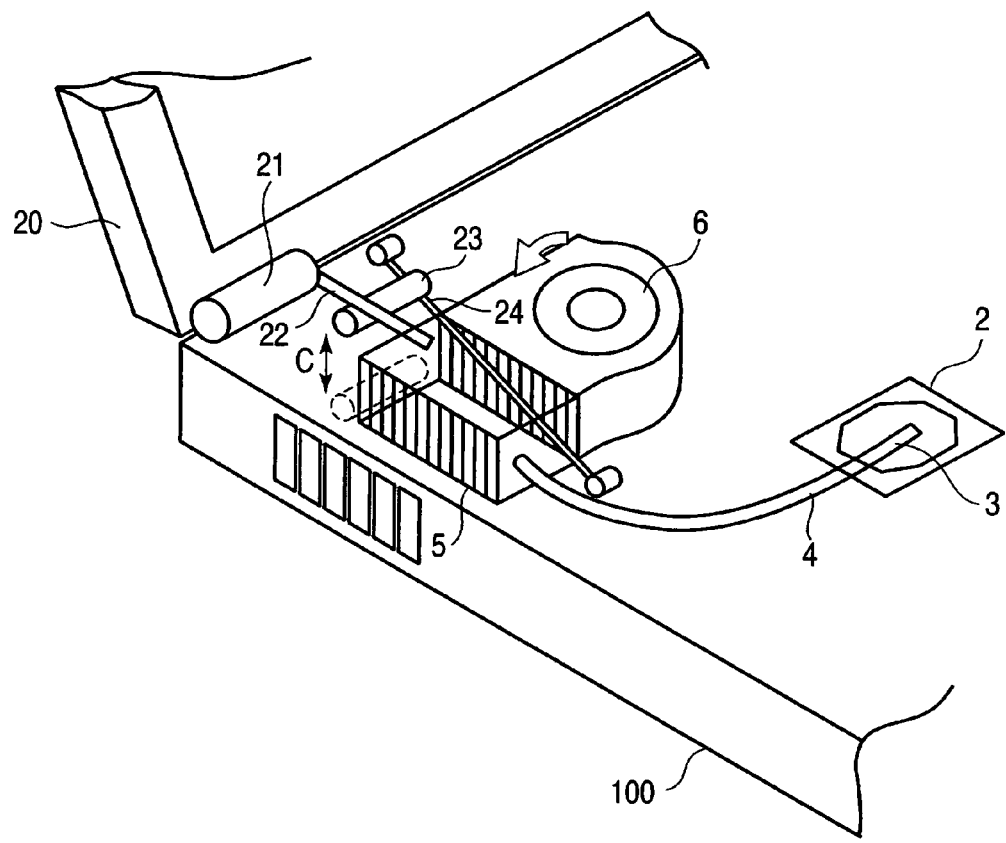
F I G. 9
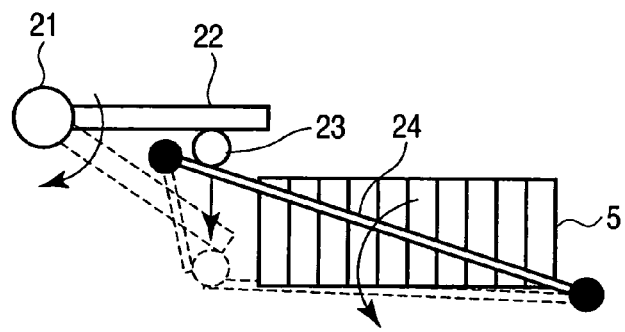
F I G. 10

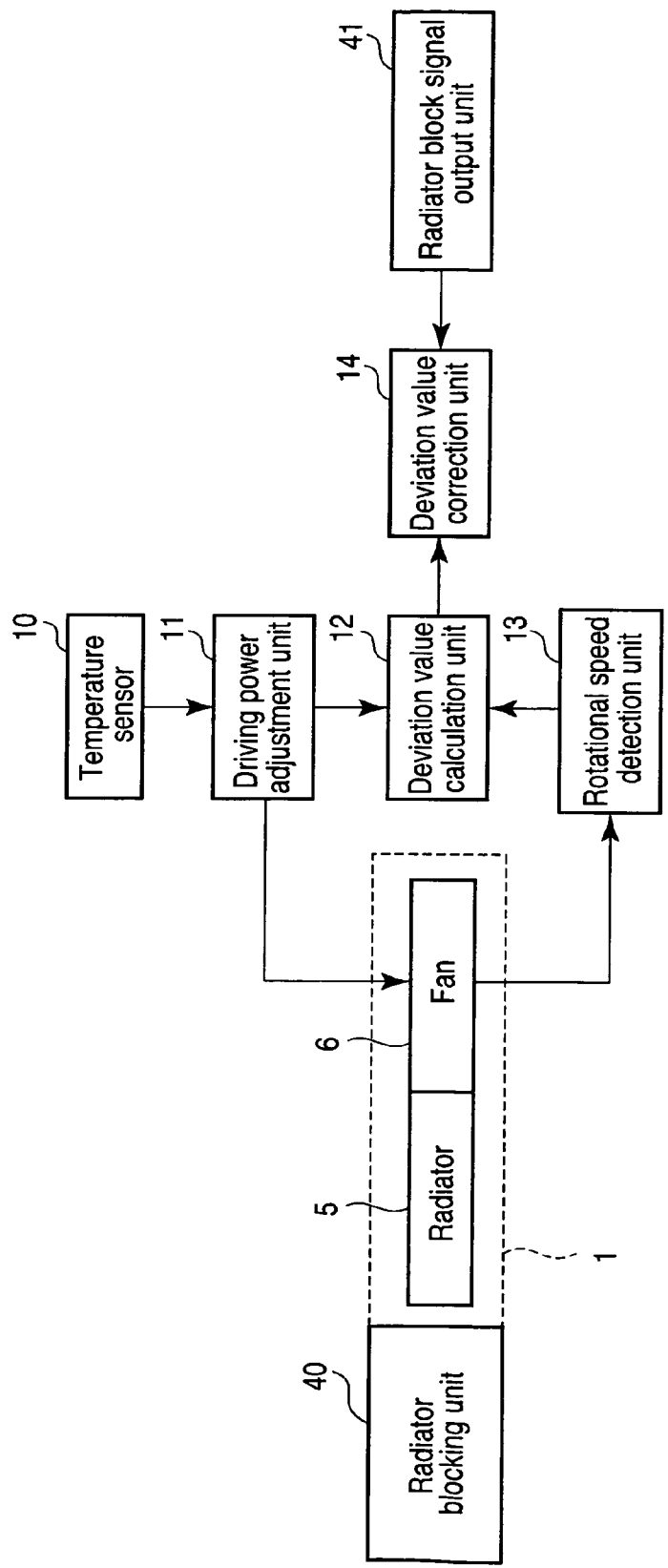
F I G. 12

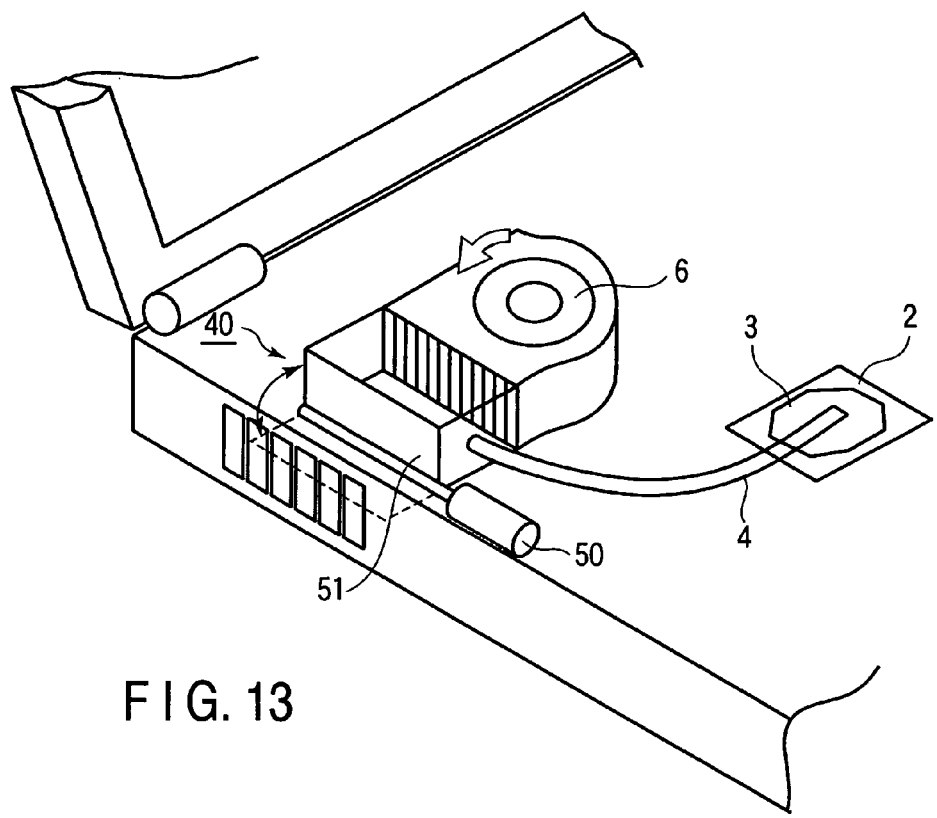
F I G. 13
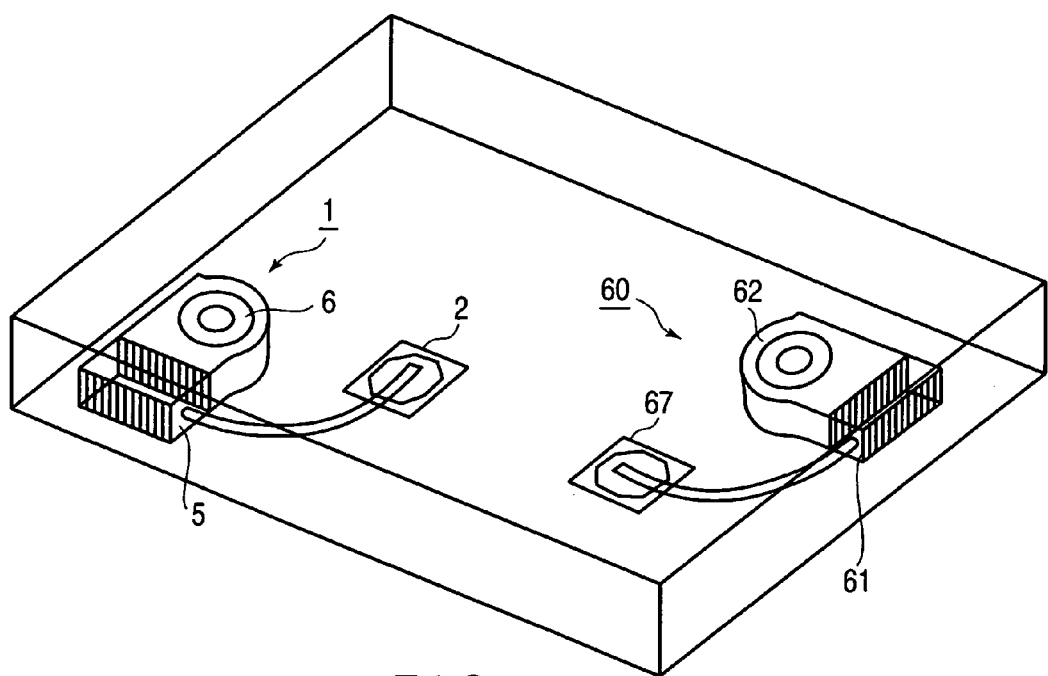
F I G. 15

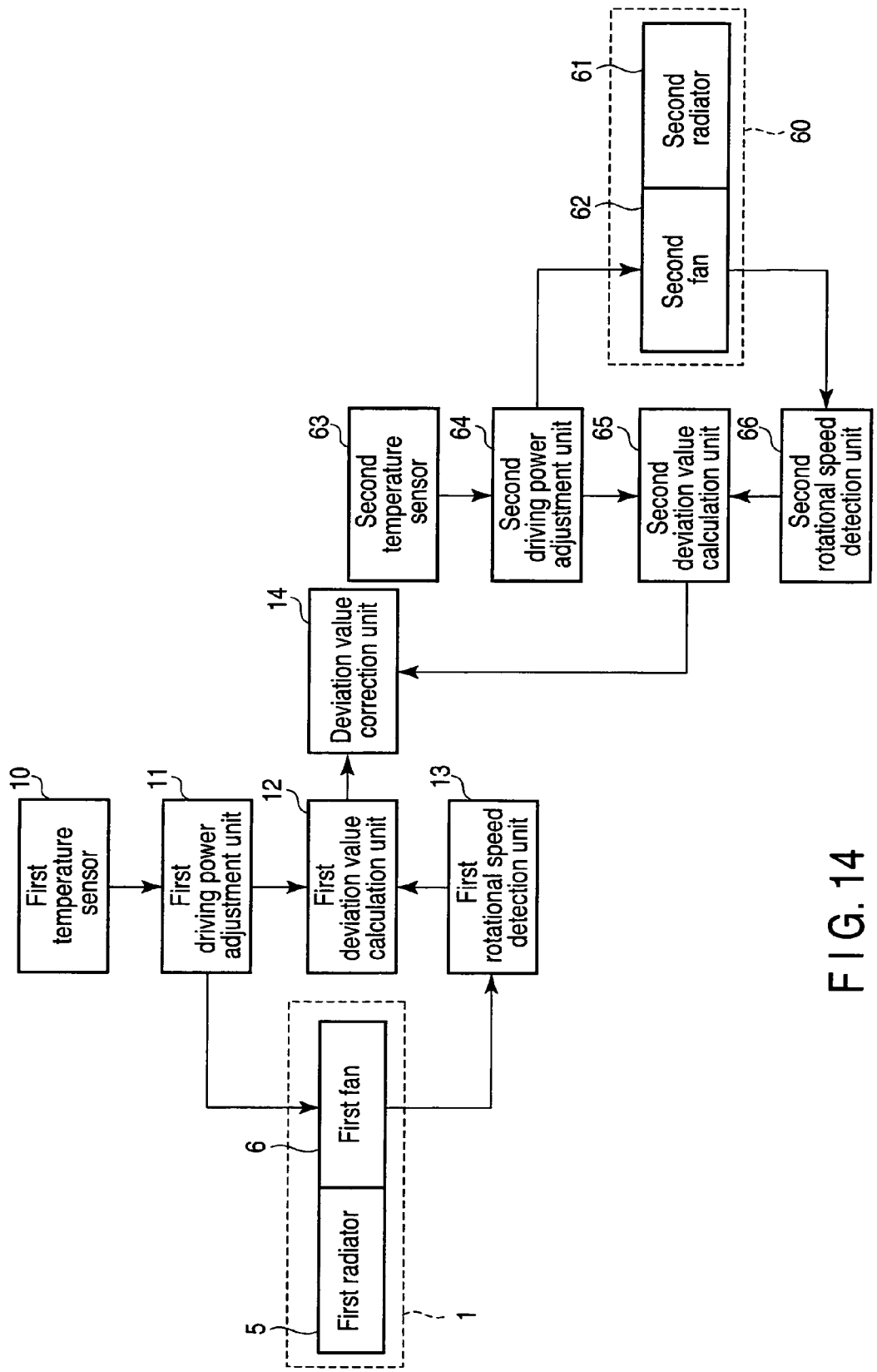
F I G. 14

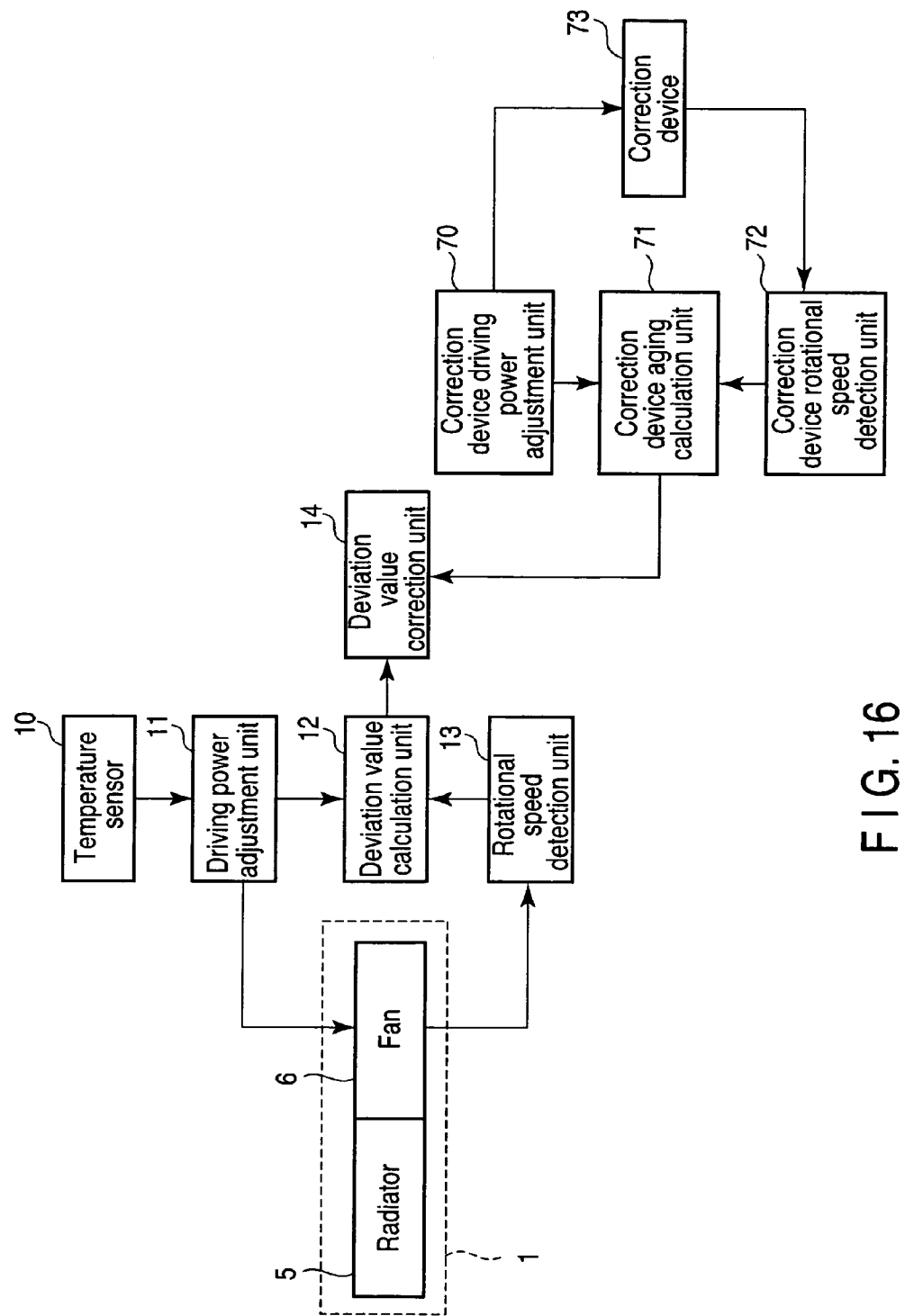
F I G. 16

ELECTRONIC DEVICE

CROSS-REFERENCE TO RELATED APPLICATIONS

This application is based upon and claims the benefit of priority from prior Japanese Patent Application No. 2008-143237, filed May 30, 2008, the entire contents of which are incorporated herein by reference.

BACKGROUND OF THE INVENTION

1. Field of the Invention

The present invention relates to an electronic device such as a notebook personal computer equipped with a cooling unit including a radiator and a fan and, more particularly, to an electronic device which detects performance degradation of a cooling unit.

2. Description of the Related Art

An electronic device such as a notebook personal computer commonly uses a cooling unit including a heat disperser, heat pipe, radiator, and fan to cool a heat generating portion such as a CPU. Heat from the heat generating portion is transferred to the heat disperser that is in contact with it and transported to the radiator through the heat pipe. The fan takes in air from an opening formed in the case of the electronic device and sends the air to the radiator. The air cools the radiator and the heat generating portion, too.

The airflow generated by driving the fan contains dust in the air, which comes into the radiator. The dust is partially discharged outside through the radiator, but some adheres particularly to its inlet, builds up gradually in the course of time, and impedes the airflow, finally affecting the cooling performance.

Several solutions are available, including detecting clogging in a dust-trap member such as a filter mounted on the radiator, cooling unit, or case opening, and at certain level of clogging, prompting the user to exchange the dust-trap member or operate a dust-removal unit incorporated in the electronic device, or causing an internal unit of the electronic device or another electronic device connected via a network to issue an instruction to automatically remove dust.

One of systems to implement this procedure detects dust clogging based on an increase in the rotational speed of the fan. For example, JP-A 2004-63993 (KOKAI) describes a technique of presetting a predetermined rotational speed in a memory, and advising filter exchange upon detecting dust clogging by comparing a detected rotational speed with the predetermined rotational speed. For example, JP-A 2007-189183 (KOKAI) describes a technique of detecting disparity between an actual rotational speed and a controlled rotational speed and recommending cleaning of a dust collector for scraping out dust.

If the fan that sends air to cool the radiator is operated alone, for example, the rotational speed at a predetermined applied duty ratio gradually decreases. The causes include degradation of lubricant used for the bearing of the fan and dust adhering near the fan rotation unit. This phenomenon cancels the increase in the rotational speed of the fan caused by increasing clogging. It therefore becomes difficult to detect dust clogging.

BRIEF SUMMARY OF THE INVENTION

According to an aspect of the present invention, an electronic device includes a radiator which dissipates heat from a heat generating portion, a fan which rotates and sends air to the radiator according to a driving power, a temperature measuring unit which measures the temperature of the heat generating portion, an adjustment unit which adjusts the driving power in accordance with a driving condition corresponding to the measured temperature, a rotational speed measuring unit which measures the rotational speed of the fan, a deviation value calculation unit which calculates a deviation value from the normal boundary of the relationship between a power index associated with the driving power adjusted by the adjustment unit and the measured rotational speed of the fan, a clogging detection unit which detects, based on the deviation value, clogging in an air duct through which the fan takes in air outside the case and sends it to the radiator, and a deviation value correction unit which corrects the deviation value in accordance with aging of performance of the fan to compensate for deterioration of the clogging detection capability of the clogging detection unit caused by the aging.

BRIEF DESCRIPTION OF THE SEVERAL VIEWS OF THE DRAWING

FIG. 3 is a block diagram showing a modification of the electronic device according to the first embodiment;

FIG. 4 is a graph showing an example of aging of a fan characteristic;

FIG. 9 is a view showing a dust removal unit;

FIG. 10 is a view showing a dust removal unit;

FIG. 12 is a block diagram of an electronic device according to the fourth embodiment;

FIG. 13 is a view showing a radiator blocking unit;

FIG. 14 is a block diagram of an electronic device according to the fifth embodiment;

FIG. 15 is a view showing a second cooling unit;

FIG. 16 is a block diagram of an electronic device according to the sixth embodiment;

DETAILED DESCRIPTION OF THE INVENTION

The embodiments of the present invention will now be described with reference to the accompanying drawing.

First Embodiment

Figure 1:
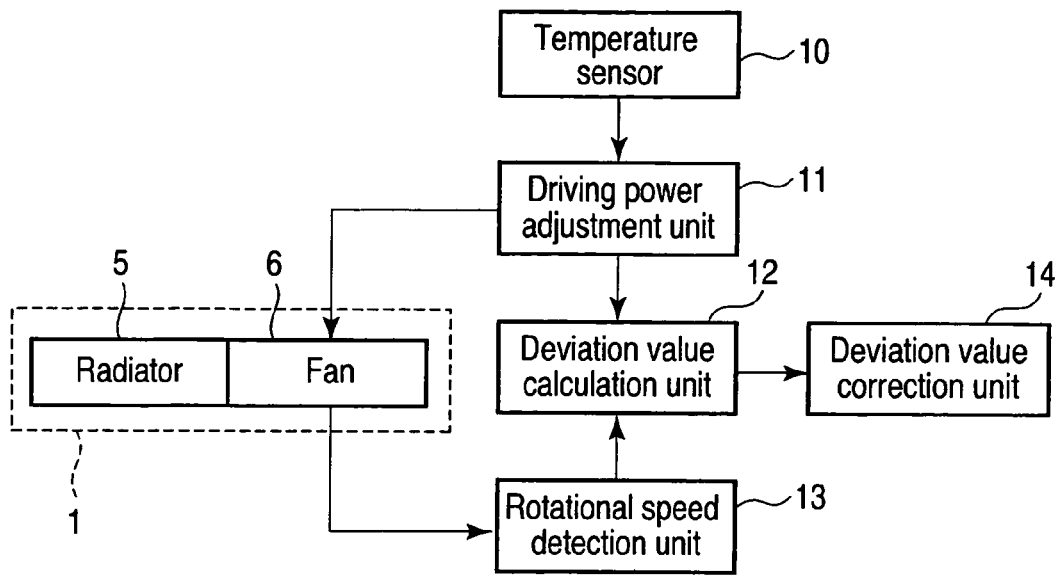
FIG. 1 is a block diagram of an electronic device according to the first embodiment.
Figure 2:
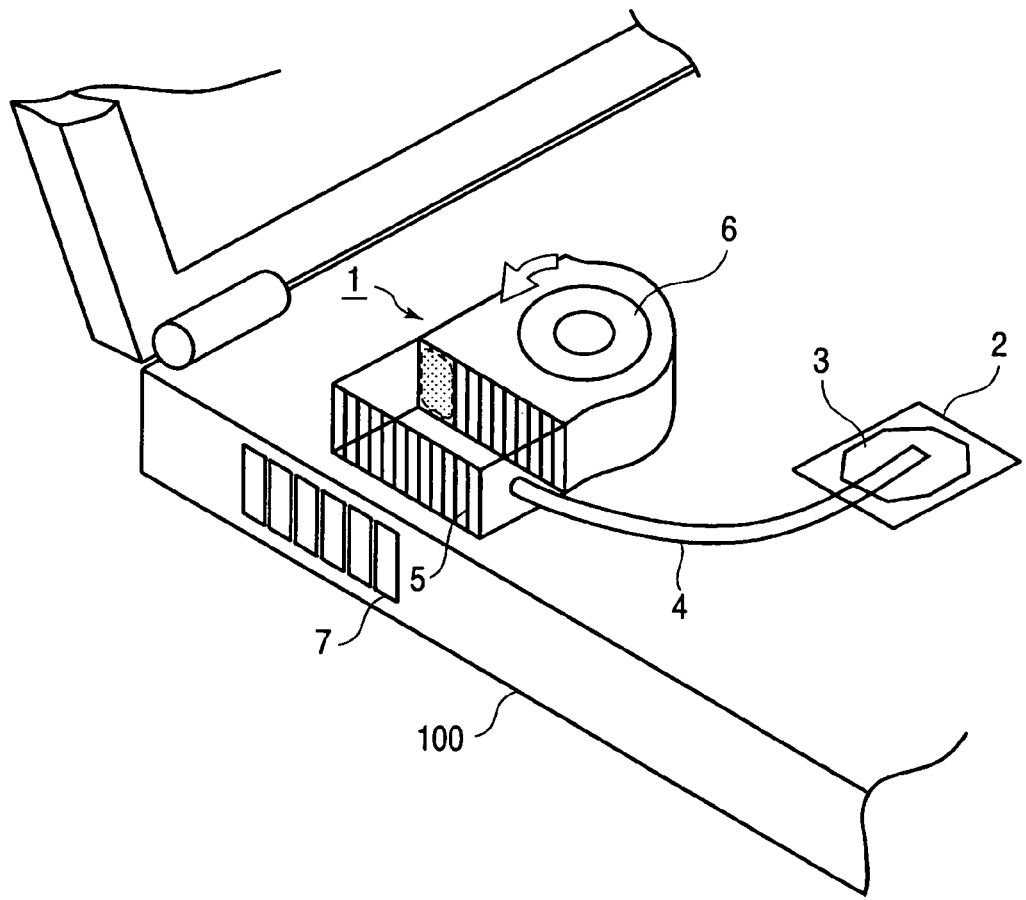
FIG. 2 is a view showing the outer appearance of a cooling unit provided inside the case of the electronic device.

FIG. 1 is a block diagram of an electronic device having a cooling performance degradation detecting function according to the first embodiment. FIG. 2 illustrates the outer appearance of a cooling unit provided inside the case of an electronic device 100.

A cooling unit 1 includes a radiator 5 which dissipates heat transported from a heat generating portion 2 such as a CPU via a heated portion 3 and a heat pipe 4, and a fan 6 which rotates and sends air to the radiator 5 according to driving power. The radiator 5 is cooled by air sent from the fan 6.

A driving power adjustment unit 11 adjusts the driving power to be input to the fan 6 in accordance with the temperature of the heat generating portion 2 measured by a temperature sensor 10 incorporated in the CPU and a driving condition corresponding to the measured temperature. If the fan 6 employs, e.g., constant voltage PWM control, the driving power adjustment unit 11 adjusts the PWM signal to be output to the fan 6. If the fan 6 uses, e.g., voltage-variable control, the driving power adjustment unit 11 adjusts the variable voltage to be applied to the fan 6.

Examples of a power index associated with the driving power adjusted by the driving power adjustment unit 11 are an applied duty ratio in PWM control and an applied voltage value. These pieces of information are available without measurement because the driving power adjustment unit 11 supplies them. A current consumption value or power consumption value is also usable as a power index. In this case, a driving power detection unit 15 shown in FIG. 3 is independently provided to measure the value.

A rotational speed detection unit 13 such as an encoder detects the rotational speed of the fan 6.

A deviation value calculation unit 12 calculates the deviation value from the normal boundary in the relationship between the power index and the rotational speed of the fan 6, and detects, based on the deviation value, clogging in the air duct through which the fan 6 takes in air outside the case of the electronic device 100 and sends it to the radiator 5 (clogging detection unit). Two kinds of clogging can mainly occur in the air duct: dust clogging and blocking by a book or the like. The former can occur in a radiator 5 or in a dust-trap member such as a filter mounted on the cooling unit 1. The latter occurs when a case opening portion 7 near the air outlet of the fan 6 is blocked by, e.g., a book.

The deviation value from the normal boundary in the relationship between the power index and the rotational speed of the fan can be calculated, for example, in the following way.

(1) The deviation value is calculated based on the difference from the normal boundary of the power index in a specific fan rotational speed domain.

(2) The deviation value is calculated based on the difference from the normal boundary of the fan rotational speed in a specific power index domain.

(3) The deviation value is calculated by substituting the power index and fan rotational speed during the operation into a determining expression having the power index and fans rotational speed as variables.

Aging of the fan characteristic will be explained here. As described above, if the fan 6 that sends air to cool the radiator 5 is operated alone, for example, the rotational speed at a predetermined applied duty ratio gradually decreases. The causes include degradation of lubricant used for the bearing of the fan 6 and dust adhering near the rotation unit of the fan 6. FIG. 4 shows an example of aging of the fan characteristic. A fan characteristic indicated by a curve A represents that a flat rotational speed is obtained from the beginning of fan use. The rotational speed moderately decreases as the operation time reaches, e.g., tens of thousands of hours. Another fan characteristic indicated by a curve B increases the rotational speed from the start of fan use to the elapse of, e.g., several hundred hours and then becomes flat during a predetermined period. Like the curve A, the rotational speed moderately decreases in the course of time.

The rotational speed of the fan 6 exhibits a flat characteristic first and then decreases due to such aging of fan characteristic. This phenomenon cancels the increase in the rotational speed of the fan 6 caused by increasing clogging. It therefore becomes difficult to detect dust clogging. This embodiment enables to eliminate the influence of such aging of fan characteristic and detect dust clogging stably, as will be described later. To compensate for deterioration of the clogging detection capability of the deviation value calculation unit 12 caused by aging of performance of the fan 6, a deviation value correction unit 14 is arranged to correct the deviation value in accordance with aging of performance of the fan 6.

In this embodiment, the above-described deviation value calculation methods (1) to (3) will be described assuming that the cooling unit adopts, e.g., PWM control.

Figure 5:
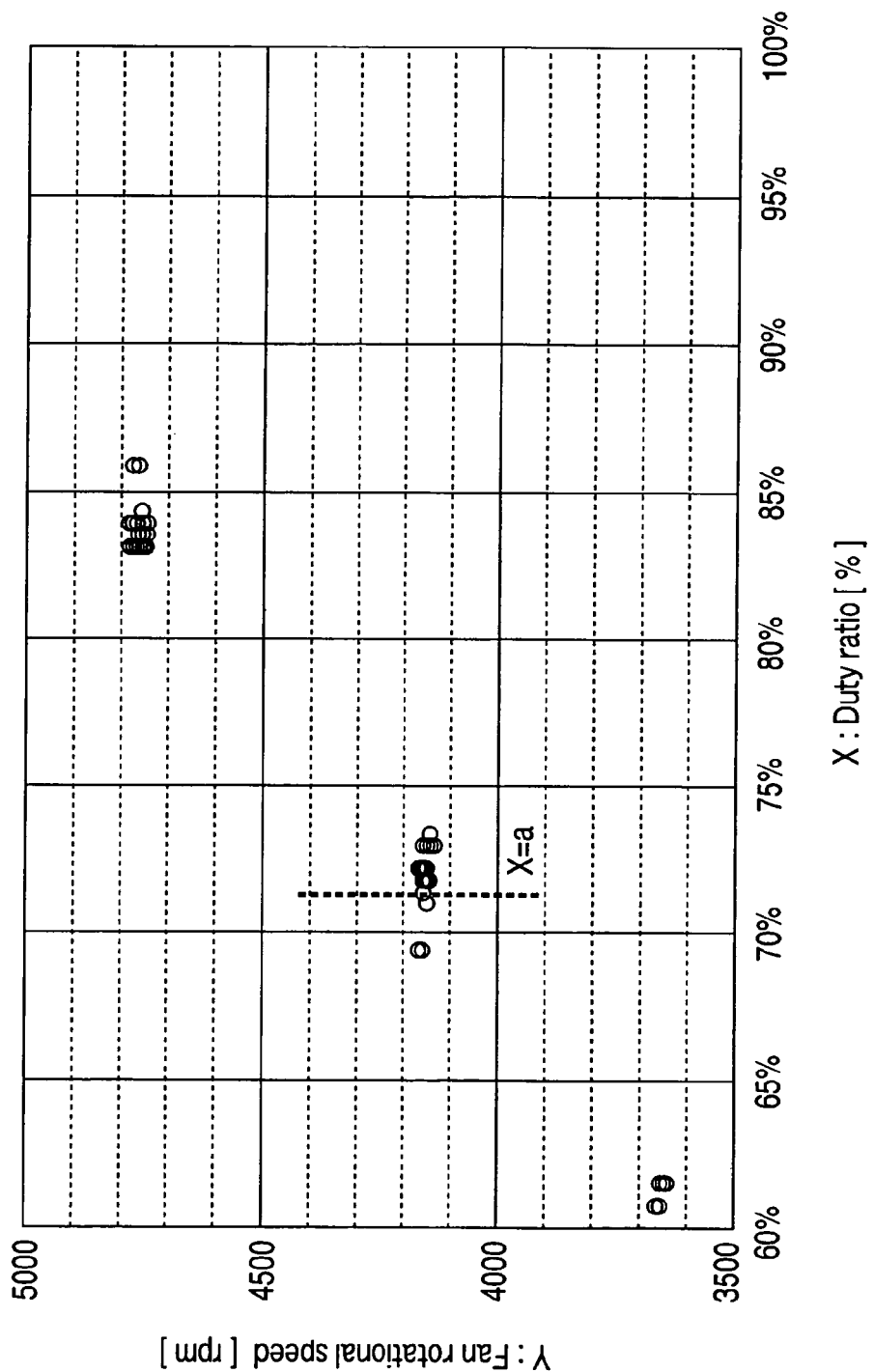
FIG. 5 is a graph showing an example of the normal boundary of the relationship between a power index and a fan rotational speed.

(1) Calculation Based on the Difference from the Normal Boundary of the Power Index in a Specific Fan Rotational Speed Domain This method is suitably used when controlling the rotational speed of the fan 6 based on the temperature measured by the temperature sensor 10. The control target, i.e., the rotational speed of the fan 6 normally uses discrete values. FIG. 5 shows the relationship between the duty ratio of the fan 6 and its rotational speed obtained by the rotational speed detection unit 13 at various clogging levels in the cooling unit 1. A rotational speed acquired actually may include values during acceleration and deceleration of the fan 6. Hence, only data at the same duty ratio that has continued for a predetermined time is left and used to calculate the deviation value.

Referring to FIG. 5, as clogging increases, the duty ratio in a rotational speed domain from 4,100 to 4,200 rpm decreases. A duty ratio in the rotational speed domain at a given clogging level is obtained in advance by, e.g., clogging simulation or the like, and set as the lower limit value of the normal state, i.e., "normal boundary" (X=a in FIG. 5). Note that the rotational speed at the same power index changes between individual fans. Hence, the lower limit value can be corrected based on the relationship between the power index and the rotational speed of the fan 6 obtained at the start of first use of each electronic device.

The duty ratio in the rotational speed domain during the actual operation is subtracted from the lower limit value, thereby obtaining a "deviation value from the normal boundary". As the clogging increases, the deviation value changes from a negative value to a positive value. An error is determined when the value has reached, e.g., 0. It is then possible to prompt the user to exchange a dust-trap member (not shown) or operate a dust removal unit (not shown) incorporated in the electronic device, or cause an internal unit of the electronic device or another electronic device connected via a network to issue an instruction to automatically do it. Note that the actual duty ratio is affected by variations caused by a slight change in the rotational speed due to the temperature of air flowing into the fan 6. Hence, an error is preferably determined when the average deviation value in a certain time is 0 or more, or the appearance frequency of a deviation value of 0 or more exceeds a predetermined count.

The deviation value correction unit 14 corrects the deviation value by introducing aging of fan performance. At a predetermined timing, the deviation value correction unit 14 corrects the relationship between the power index and the fan rotational speed. In this case, since the duty ratio that gives a predetermined rotational speed domain tends to rise due to aging of performance of the single fan 6, the lower limit value of the normal boundary is corrected to a value slightly larger than before. More specifically, the relational expression X=a is corrected to X=a+s (s is a positive value).

(2) Calculation Based on the Difference from the Normal Boundary of the Fan Rotational Speed in a Specific Power Index Domain This method is suitably used when controlling the duty ratio based on the temperature measured by the temperature sensor 10. In this case, as clogging increases, the rotational speed of the heat generating portion 2 rises in a predetermined duty ratio domain. A rotational speed in the duty ratio domain at a given clogging level is obtained in advance by, e.g., clogging simulation or the like, and set as the upper limit value of the normal state, i.e., "normal boundary". Note that the rotational speed at the same power index changes between individual fans 6. Hence, the upper limit value can be corrected based on the relationship between the power index and the rotational speed of the fan 6 obtained at the start of first use of each electronic device.

The upper limit value is subtracted from the rotational speed in the duty ratio domain during the actual operation, thereby obtaining a "deviation value from the normal boundary". As the clogging increases, the deviation value changes from a negative value to a positive value.

The deviation value correction unit 14 corrects the deviation value by introducing aging of performance of the fan 6. In this case, since the rotational speed in a predetermined duty ratio domain tends to decrease due to aging of performance of the single fan 6, the upper limit value of the normal boundary is corrected to a value slightly smaller than before.

Figure 6:
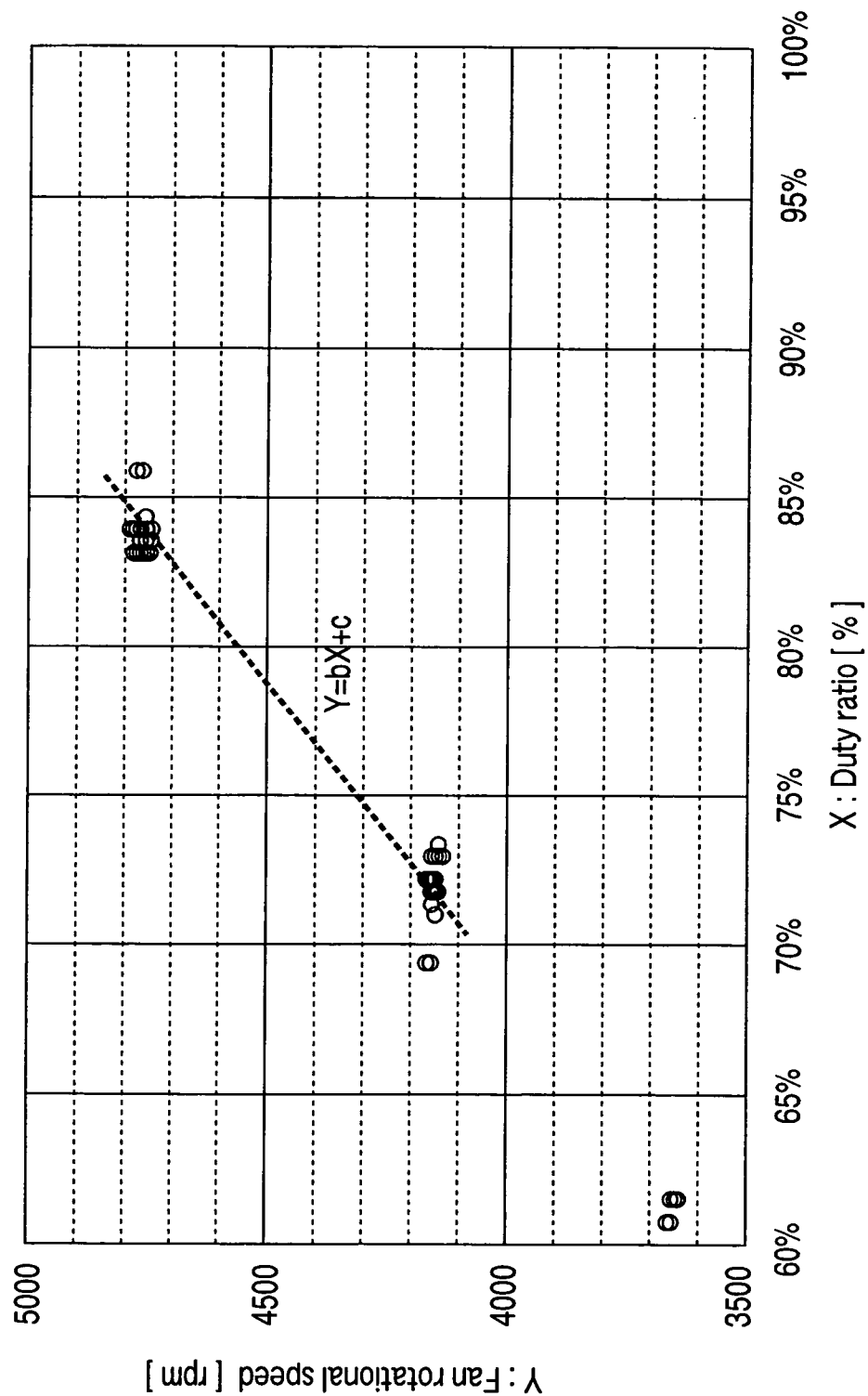
FIG. 6 is a graph showing another example of the normal boundary of the relationship between a power index and a fan rotational speed.

(3) Calculation by Substituting the Power Index and Fan Rotational Speed During the Operation Into a Determining Expression Having the Power Index and Fans Rotational Speed as Variables The method (3) will finally be described below with reference to FIG. 6. FIG. 6 shows the relationship between the duty ratio and the rotational speed at various clogging levels in the cooling unit 1 when controlling the rotational speed of the fan 6 based on the temperature measured by the temperature sensor 10, as in FIG. 5.

Referring to FIG. 6, as clogging increases, the duty ratio in each rotational speed domain decreases. The relationship between the duty ratio and the rotational speed at a given clogging level is obtained in advance by, e.g., clogging simulation or the like, and set as a determining expression (Y−bX−c) representing the lower limit value of the normal state, i.e., "normal boundary". Two or more rotational speed domains are used to obtain the relationship. The rotational speed is preferably high. Note that the rotational speed at the same power index changes between individual fans 6. Hence, the determining expression can be corrected based on the relationship between the power index and the rotational speed of the fan 6 obtained at the start of first use of each electronic device.

The duty ratio X and the rotational speed Y during the actual operation are substituted into the determining expression, thereby obtaining a "deviation value from the normal boundary". As the clogging increases, the deviation value changes from a negative value to a positive value. An error is determined when the value has reached, e.g., 0. It is then possible to prompt the user to exchange a dust-trap member or operate a dust removal unit incorporated in the electronic device in advance, or cause an internal unit of the electronic device or another electronic device connected via a network to issue an instruction to automatically do it. Note that the rotational speed slightly changes due to the temperature of air flowing into the fan 6. Hence, an error can be determined when the average deviation value in a certain time is 0 or more, or the appearance frequency of a deviation value of 0 or more exceeds a predetermined count.

The deviation value correction unit 14 corrects the deviation value by introducing aging of fan performance. At a predetermined timing, the deviation value correction unit 14 corrects the relationship between the power index and the rotational speed of the fan 6. In this case, since the duty ratio that gives a predetermined rotational speed domain tends to rise due to aging of performance of the single fan 6, the determining expression representing the normal boundary is corrected from Y−bX−c to Y−bX−c+t (t is a positive value).

The electronic device according to the above-described first embodiment includes the deviation value correction unit 14 which corrects the deviation value in accordance with aging of performance of the fan 6 to compensate for deterioration of the clogging detection capability of the deviation value calculation unit 12 caused by aging of performance of the fan 6. It is therefore possible to detect dust clogging stably.

Second Embodiment

Figure 7:
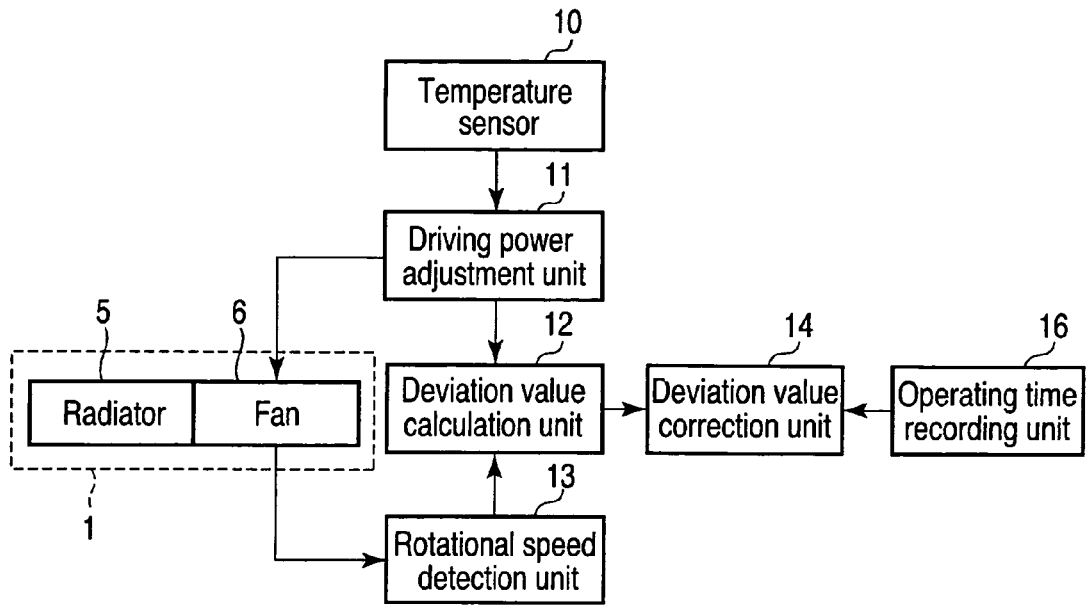
FIG. 7 is a block diagram of an electronic device according to the second embodiment.

FIG. 7 is a block diagram of an electronic device according to the second embodiment. The electronic device shown in FIG. 7 is formed by adding an operating time recording unit 16 to an electronic device 100 shown in FIG. 1. The same reference numbers as in FIG. 1 denote the same parts in FIG. 7, and a description thereof will be omitted.

The operating time recording unit 16 records the sum of the operating times of a fan 6. Correction is done using an aging expression (performance estimating expression) of the rotational speed of the fan 6 using the sum as a variable. The performance estimating expression may give a temporal decrease amount of the rotational speed at a predetermined duty ratio or a temporal increase amount of the duty ratio at a predetermined rotational speed. For example, in (1) of the first embodiment, the difference between the duty ratio at a predetermined rotational speed in the first use and that at a given timing is defined as a value s in X=a+s. Alternatively, the value s may be corrected if a prior test or the like has revealed that the difference value changes depending on the clogging level. The variables of the performance estimating expression can also include the rotational speed and bearing temperature of the fan 6 in addition to the sum of the operating times of the fan 6.

Third Embodiment

Figure 8:
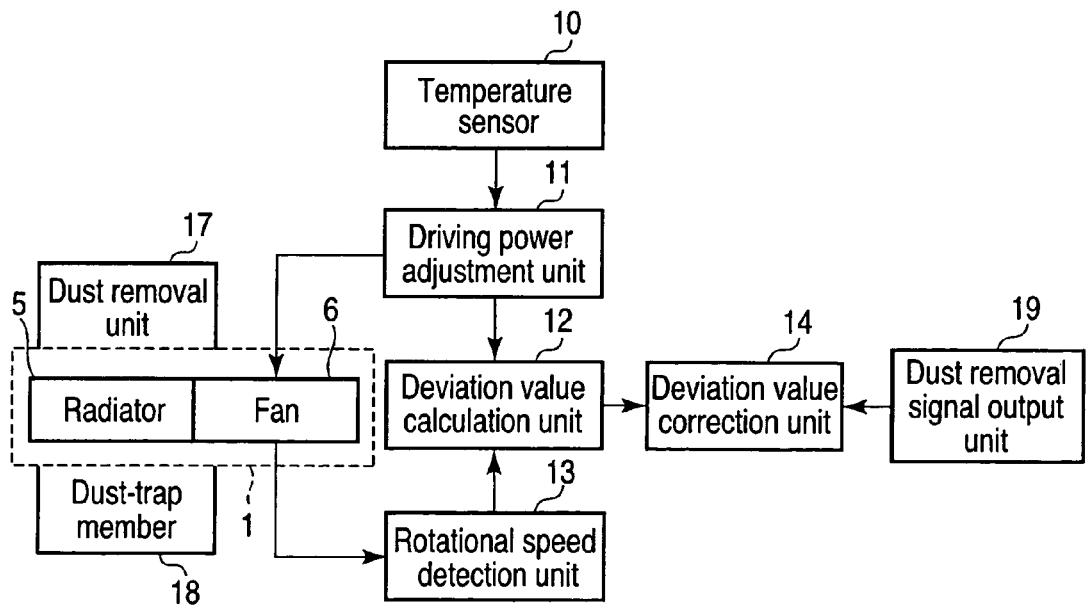
FIG. 8 is a block diagram of an electronic device according to the third embodiment.

FIG. 8 is a block diagram of an electronic device according to the third embodiment. The electronic device shown in FIG. 8 is formed by adding a dust removal unit 17 and a dust removal signal output unit 19 to an electronic device 100 shown in FIG. 1. The same reference numbers as in FIG. 1 denote the same parts in FIG. 8, and a description thereof will be omitted.

Upon detecting dust clogging based on a calculated deviation value, a deviation value calculation unit 12 instructs the user to operate the dust removal unit 17. This operation may automatically be done by causing an internal unit of the electronic device or another electronic device connected via a network to issue an instruction.

FIGS. 9 and 10 are views showing the dust removal unit 17. A hinge 21 which rotatably connects a display 20 to the case of the electronic device 100 may have a rotation spring or gear attached to it. The hinge 21 has a driving rod 22 which rotates as the display 20 opens or closes. The driving rod 22 rotates to press a push component 23 downward in a direction C in FIG. 9. Then, a dust removal member 24 formed from a wire or brush with spring moves downward. The dust removal member 24 is arranged in contact with the inlet surface of a radiator 5 (where dust particularly readily builds up) to remove dust.

When dust removal by the dust removal unit 17 has ended, the dust removal signal output unit 19 outputs a dust removal signal to a deviation value correction unit 14. After receiving the dust removal signal, the deviation value correction unit 14 executes correction. The correction is done based on the difference between the relationship between a power index and the rotational speed of a fan 6 obtained at the start of first use of the electronic device and that obtained in the operation as soon as possible after the signal reception. For example, in (1) of the first embodiment, the difference between the duty ratio that gives a predetermined rotational speed domain in the first use and that in the operation as soon as possible after the signal reception is defined as a value s in X=a+s. Alternatively, the value s may be corrected if a prior test or the like has revealed that the difference value between the rotational speed of the fan 6 in the first use and that when aging has occurred changes depending on the clogging level.

A dust-trap member 18 such as a filter may be mounted on the cooling unit 1 or the case opening of the electronic device 100 in place of the dust removal unit 17.

Figure 11A:
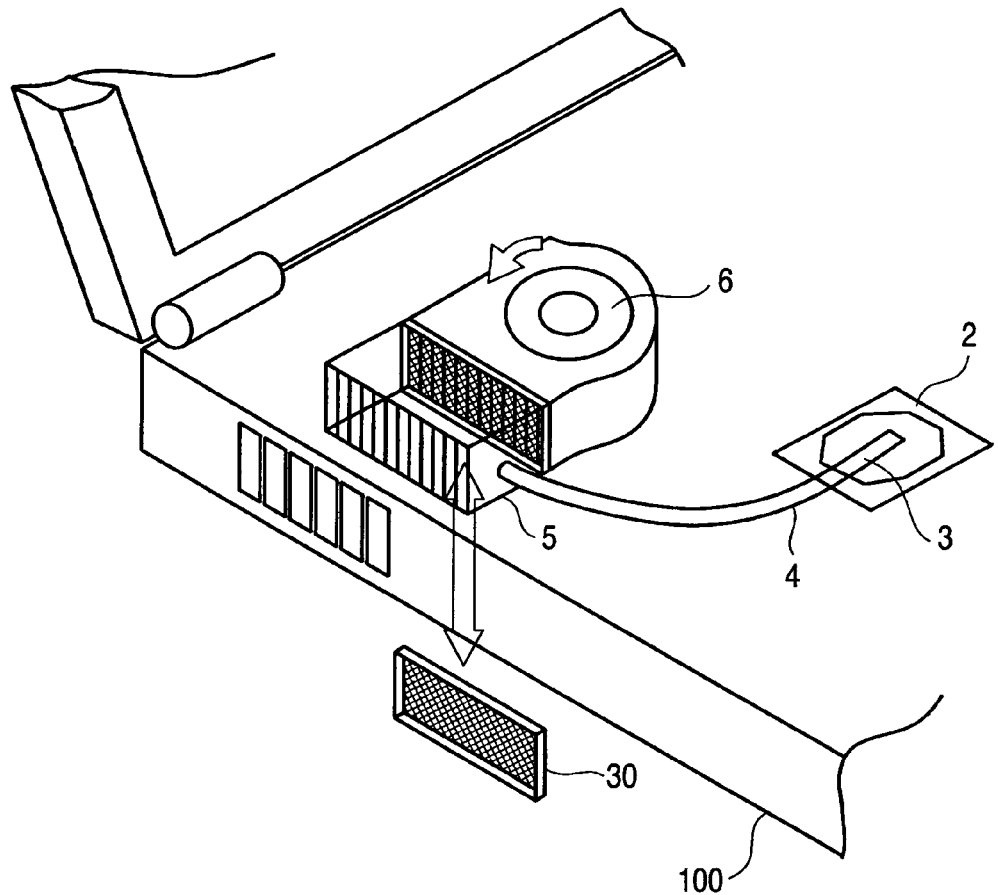
FIGS. 11A and 11B are views showing a dust-trap member.
Figure 11B:
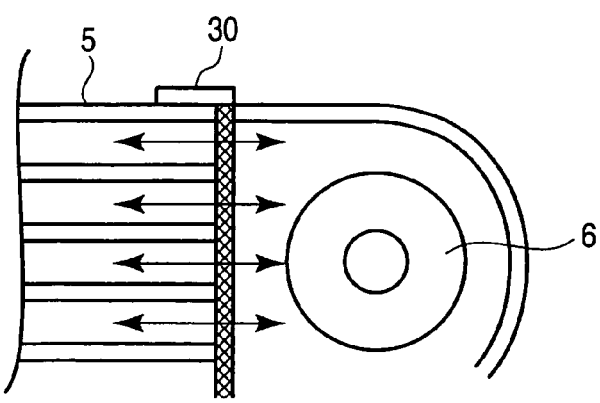

FIGS. 11A and 11B are views showing a dust-trap member 30. The dust-trap member 30 is inserted between the radiator 5 and the fan 6 to trap dust at the inlet surface of the radiator 5 using, e.g., a mesh filter. The user can detach the dust-trap member 30 from the bottom of the case of the electronic device 100 for exchange or cleaning.

Upon detecting dust clogging based on a calculated deviation value, the deviation value calculation unit 12 instructs the user to detach the dust-trap member 30. The user exchanges the detached dust-trap member 30 with a new one or cleans it, and reattaches the dust-trap member. After reattachment, the user performs an operation of causing the dust removal signal output unit 19 to output a signal to the deviation value correction unit 14. Alternatively, the electronic device detects the reattachment and automatically outputs a signal.

Fourth Embodiment

FIG. 12 is a block diagram of an electronic device according to the fourth embodiment. The electronic device shown in FIG. 12 is formed by adding a radiator blocking unit 40 and a radiator block signal output unit 41 to an electronic device 100 shown in FIG. 1. The same reference numbers as in FIG. 1 denote the same parts in FIG. 12, and a description thereof will be omitted.

As shown in FIG. 13, the radiator blocking unit 40 has a shielding plate 51 to be rotated by a small motor 50 to block the overall surface of the outlet of a radiator 5.

An internal unit of the electronic device 100 or another electronic device connected via a network instructs the user to operate the radiator blocking unit 40. The blocking operation may be done automatically without instructing the user. At this operation, the heat value from a heat generating portion 2 connected to the radiator 5 via a heat pipe 4 is preferably as small as possible. When the radiator blocking unit 40 performs the blocking operation, the radiator block signal output unit 41 outputs a block signal to a deviation value correction unit 14. Upon receiving the signal, the deviation value correction unit 14 executes correction.

The correction is done based on the difference between the relationship between a power index and the rotational speed of a fan 6 obtained after the radiator blocking unit 40 has performed the operation at the start of first use of the electronic device and that obtained after a predetermined time has elapsed, and the radiator blocking unit 40 has performed the operation.

For example, in (1) of the first embodiment, the difference between the duty ratio that gives a predetermined rotational speed domain in the first use and that in the operation after the elapse of a predetermined time when the overall surface of the outlet of the radiator 5 is blocked is defined as a value s in X=a+S. Alternatively, the value s may be corrected if a prior test or the like has revealed that the difference value between the rotational speed of the fan 6 in the first use and that when aging has occurred changes depending on the clogging level.

The fourth embodiment performs compensation based on a measurement value obtained by uniquely defining the state of the radiator 5. The difference reflects aging of fan performance.

Fifth Embodiment

FIG. 14 is a block diagram of an electronic device according to the fifth embodiment. The electronic device shown in FIG. 14 is formed by adding a second cooling unit 60 to an electronic device 100 shown in FIG. 1. The second cooling unit 60 includes a second radiator 61, second fan 62, second temperature sensor 63, second driving power adjustment unit 64, aging calculation unit 65, and second rotational speed detection unit 66. As shown in FIG. 15, the second cooling unit 60 removes heat from a heat generating portion 67 different from a heat generating portion 2, and has the same arrangement as a cooling unit 1.

The second fan 62 of the cooling unit 60 preferably has a bearing structure of the same type (e.g., fluid bearing) as a fan 6 of the cooling unit 1. The operating time of the first fan 6 and that of the second fan 62 are preferably almost equal. The radiator 61 combined with the second fan 62 needs to have a structure such as a wide fin pitch that hardly causes dust clogging.

The second driving power adjustment unit 64 outputs a PWM signal to drive the second fan 62 (in constant voltage PWM control) or adjusts a voltage (in voltage-variable control). The second rotational speed detection unit 66 such as an encoder detects the rotational speed of the second fan 62. The aging calculation unit 65 calculates aging of performance of the second fan 62 based on information obtained from the second rotational speed detection unit 66. The aging is calculated by, e.g., obtaining the difference between the relationship between a power index and the rotational speed of the second fan 62 obtained at the start of first use of the electronic device and that obtained in the operation after the elapse of a predetermined time.

The aging information is sent to a deviation value correction unit 14. Based on the information, the deviation value correction unit 14 can correct the deviation value from the normal boundary of the relationship between the power index and the rotational speed of the fan.

Sixth Embodiment

FIG. 16 is a block diagram of an electronic device according to the sixth embodiment. The electronic device shown in FIG. 16 is formed by adding an correction device 73, correction device driving power adjustment unit 70, correction device rotational speed detection unit 72, and correction device aging calculation unit 71 to an electronic device 100 shown in FIG. 1. The same reference numbers as in FIG. 1 denote the same parts in FIG. 16, and a description thereof will be omitted.

Figure 17:
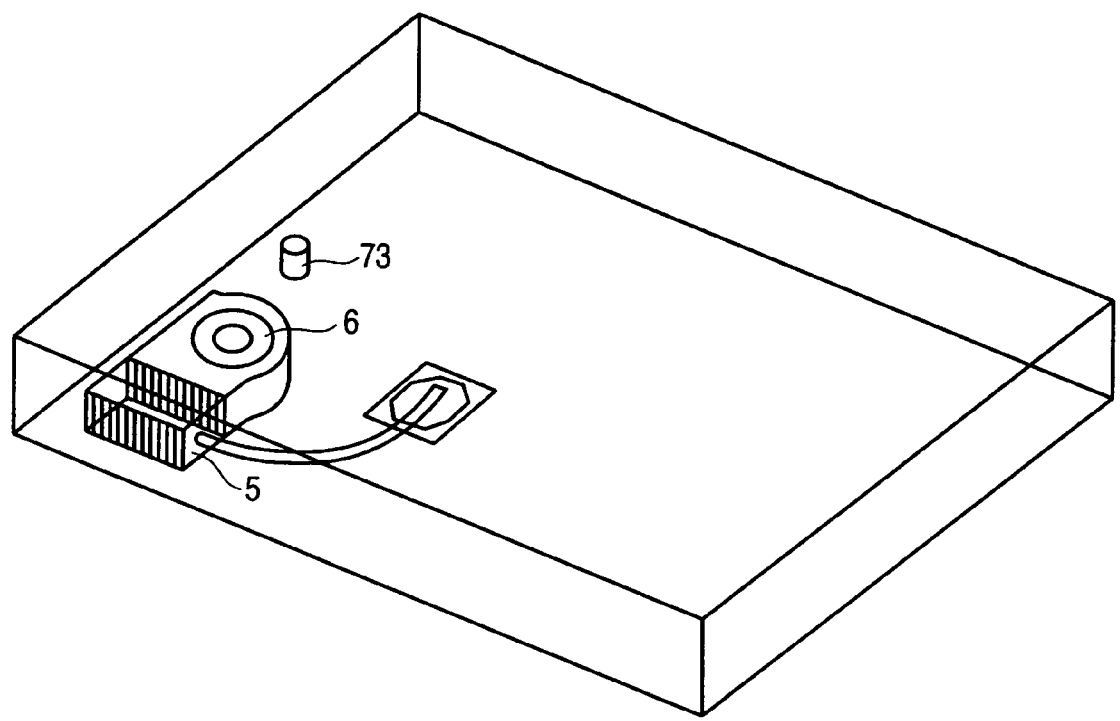
FIG. 17 is a view showing a correction device.
Figure 18:
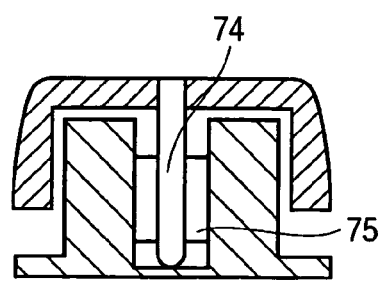
FIG. 18 is a sectional view of the correction device.

FIG. 17 illustrates the outer appearance of the correction device 73. FIG. 18 is a sectional view of the correction device 73.

The correction device 73 has at least a rotation unit. When a shaft 74 attached to a bearing 75 is driven by a driving voltage, a vaneless rotor rotates. The correction device 73 has the same structure as a fan 6 of a cooling unit 1 except the absence of vanes. Note that the correction device 73 may have completely the same structure as the fan 6 without using the vaneless rotor.

Use of a vaneless rotor as shown in FIG. 18 enables size reduction of the correction device 73. However, the structure of the bearing 75 is preferably of the same type (e.g., fluid bearing) as the fan 6. The correction device 73 preferably operates always at the same rotational speed as the fan 6.

The correction device driving power adjustment unit 70 outputs a PWM signal to drive the correction device 73 (in constant voltage PWM control) or adjusts a voltage (in voltage-variable control). The correction device rotational speed detection unit 72 such as an encoder can detect the rotational speed of the correction device 73. The correction device aging calculation unit 71 calculates aging of performance of the correction device 73 based on information obtained from the correction device rotational speed detection unit 72. The aging information is sent to a deviation value correction unit 14. Based on the information, the deviation value correction unit 14 corrects the deviation value from the normal boundary of the relationship between the power index and the rotational speed of the fan 6.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic device comprising:
 a first radiator which dissipates heat transported from a first heat generating portion via a first heat transport unit;
 a first fan which rotates and sends air to the first radiator according to a first driving power;
 a first temperature measuring unit which measures a temperature of the first heat generating portion;
 a first adjustment unit which adjusts the first driving power in accordance with a driving condition corresponding to the temperature measured by the first temperature measuring unit;
 a first rotational speed measuring unit which measures a rotational speed of the first fan;
 a deviation value calculation unit which calculates a deviation value from a normal boundary of a relationship between a power index associated with the first driving power adjusted by the first adjustment unit and the rotational speed of the first fan measured by the first rotational speed measuring unit;
 a clogging detection unit which detects, based on the deviation value, clogging in an air duct through which the first fan takes in air outside a case and sends the air to the first radiator; and
 a deviation value correction unit which corrects the deviation value in accordance with aging of performance of the first fan to compensate for deterioration of a clogging detection capability of the clogging detection unit caused by the aging.

2. The device according to claim 1, wherein the power index is at least one of an applied duty ratio in PWM control, an applied voltage value, a current consumption value, and a power consumption value.

3. The device according to claim 1, further comprising an operating time recording unit which records an operating time of the first fan, and
 wherein the deviation value correction unit obtains the aging of performance of the first fan in accordance with a performance estimating expression having the operating time of the first fan as a variable.

4. The device according to claim 1, further comprising a dust removal signal output unit which outputs a dust removal signal after dust removal by a dust removal unit or after reattachment of a dust-trap member, and
 wherein the deviation value correction unit corrects the deviation value using, as a correction amount, a difference between a relationship between the power index and the rotational speed of the fan at a start of first use and a relationship between the power index and the rotational speed of the first fan when the dust removal signal has been output.

5. The device according to claim 1, further comprising a block signal output unit which outputs a block signal when a blocking unit has blocked an air duct from the first radiator to outside the case, and
 wherein the deviation value correction unit corrects the deviation value using, as a correction amount, a difference between a relationship between the power index and the rotational speed of the fan at a start of first use when the block signal has been output and a relationship between the power index and the rotational speed of the fan after an elapse of a predetermined time when the block signal has been output.

6. The device according to claim 1, further comprising:
 a second radiator which has a structure that hardly causes dust buildup, and dissipates heat transported from a second heat generating portion via a second heat transport unit;
 a second fan which rotates and sends air to the second radiator according to a second driving power;
 a second temperature measuring unit which measures a temperature of the second heat generating portion;
 a second adjustment unit which adjusts the second driving power in accordance with a driving condition corresponding to the temperature measured by the second temperature measuring unit;
 a second rotational speed measuring unit which measures a rotational speed of the second fan; and
 a unit which obtains aging of the second fan based on a power index associated with the second driving power adjusted by the second adjustment unit and the rotational speed of the second fan measured by the second rotational speed measuring unit, and
 wherein the deviation value correction unit corrects the deviation value in accordance with the aging of the second fan.

7. The device according to claim 1, further comprising:
 a correction device which has the same bearing structure as the first fan and includes a rotating shaft which rotates according to a third driving power;
 a third adjustment unit which adjusts the third driving power in accordance with a driving condition;
 a third rotational speed measuring unit which measures a rotational speed of the rotating shaft; and
 a unit which obtains aging of the first fan based on a power index associated with the third driving power adjusted by the third adjustment unit and the rotational speed of the rotating shaft measured by the third rotational speed measuring unit, and wherein the deviation value correction unit corrects the deviation value in accordance with the aging of the first fan.

8. The device according to claim 7, wherein the driving condition is set to make the rotating shaft of the correction device rotate at the same rotational speed as the first fan.

* * * * *